(12) United States Patent
Ohbayashi

(10) Patent No.: US 6,373,760 B1
(45) Date of Patent: Apr. 16, 2002

(54) STATIC TYPE SEMICONDUCTOR MEMORY DEVICE ADOPTING A REDUNDANCY SYSTEM

(75) Inventor: Shigeki Ohbayashi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/846,197

(22) Filed: May 2, 2001

(30) Foreign Application Priority Data

Dec. 8, 2000 (JP) ........................................ 2000-374261

(51) Int. Cl.$^7$ ................................................ G11C 7/00
(52) U.S. Cl. ..................... 365/200; 365/156; 365/225.7
(58) Field of Search ............................... 365/154, 156, 365/200, 225.7, 96, 189.09

(56) References Cited

U.S. PATENT DOCUMENTS

| 4,596,003 A | 6/1986 | Shimizu ..................... 369/189 |
| 5,703,816 A | * 12/1997 | Nam .......................... 365/200 |
| 5,706,231 A | 1/1998 | Kokubo ...................... 369/200 |
| 5,744,844 A | 4/1998 | Higuchi ...................... 257/369 |

FOREIGN PATENT DOCUMENTS

| JP | 64-32670 | 2/1989 |
| JP | 2-76244 | 3/1990 |
| JP | 3-58184 | 9/1991 |
| JP | 7-230699 | 8/1995 |
| JP | 9-17194 | 1/1997 |
| JP | 9-270468 | 10/1997 |
| JP | 10-11993 | 1/1998 |

* cited by examiner

Primary Examiner—A. Zarabian
(74) Attorney, Agent, or Firm—McDermott, Will & Emery

(57) ABSTRACT

This SRAM includes a P-channel MOS transistor which is provided corresponding to each row and connected between one end of the memory cell power source line of the corresponding row and the line of the power source potential and which has a comparatively high conduction resistance value, and a program circuit that lets the P-channel MOS transistor become electrically non-conducted when a fuse is cut. Therefore, electric currents are prevented from flowing to a short-circuited part of the defective memory cell MC, and the leakage electric current can be restrained to a small value even if a latch-up phenomenon is generated.

6 Claims, 14 Drawing Sheets

STATIC TYPE SEMICONDUCTOR MEMORY DEVICE ADOPTING A REDUNDANCY SYSTEM

BACKGROUND OF THE INVENTION

1. Field of the Invention

The present invention relates to a static type semiconductor memory device, and more particularly to a static type semiconductor memory device adopting a redundancy system for replacing a defective row or column with a spare row or column.

2. Description of the Background Art

FIG. 10 is a circuit block diagram illustrating a construction of a conventional static random access memory (hereafter referred to as SRAM).

Referring to FIG. 10, this SRAM includes a plurality of memory cells MC arranged in plural rows and plural columns (four rows and four columns in the example shown in FIG. 10), a word line WL provided corresponding to each row, and a pair of bit lines BL, /BL provided corresponding to each column.

This SRAM further includes bit line loads 31, 32 provided corresponding to each pair of bit lines BL, /BL for charging the corresponding pair of bit lines BL, /BL to an "H" level, a pair of data input/output lines IO, /IO, a column selection gate 33 provided corresponding to each pair of bit lines BL, /BL for connecting between the corresponding pair of bit lines BL, /BL and the pair of data input/output lines IO, /IO, and a column selection line CSL provided corresponding to each pair of bit lines BL, /BL.

The bit line loads 31, 32 include a pair of P-channel MOS transistors that are respectively connected between the power source potential VDD and one end of the bit lines BL, /BL, and whose gates are both connected to the line of a ground potential VSS. The column selection gate 33 includes a pair of N-channel MOS transistors that are respectively connected between the other end of the bit lines BL, /BL and one end of the data input/output lines IO, /IO and whose gates are both connected to a column decoder 37 via the column selection line CSL.

Further, this SRAM includes a row decoder 34, a control circuit 36, a column decoder 37, a writing circuit 38, and a reading circuit 39. The row decoder 34 selects one word line WL from a plurality of word lines WL in accordance with a row address signal given from the outside, and raises the selected word line WL from an "L" level, i.e. a non-selected level, to an "H" level, i.e. a selected level. The row decoder 34 includes an N-channel MOS transistor 35 provided corresponding to each word line WL for setting the corresponding word line WL to be at an "L" level, i.e. the non-selected level. FIG. 10 shows a state in which the power source potential VDD is given to the gate of each N-channel MOS transistor 35, and each word line WL is grounded via the corresponding N-channel MOS transistor 35. The control circuit 36 controls the entire SRAM in accordance with a control signal given from the outside. The column decoder 37 selects one column selection line CSL from a plurality of column selection lines CSL in accordance with a column address signal given from the outside, and raises the selected column selection line CSL from the "L" level, i.e. the non-selected level, to the "H" level, i.e. the selected level.

The writing circuit 38 and the reading circuit 39 are both connected to the other end of the pair of data input/output lines IO, /IO. The writing circuit 38 writes data DI given from the outside into a memory cell MC selected by the row decoder 34 and the column decoder 37. The reading circuit 39 outputs read data DO from a memory cell MC selected by the row decoder 34 and the column decoder 37 to the outside.

Next, an operation of the SRAM shown in FIG. 10 will be described. At the time of a writing operation, the word line WL of the row corresponding to the row address signal is raised to the "H" level, i.e. the selected level, by the row decoder 34, and each memory cell MC in the row is activated. Subsequently, the column selection line CSL of the column corresponding to the column address signal is raised to the "H" level, i.e. the selected level, by the column decoder 37, and the activated memory cell MC in the column is connected to the writing circuit 38 via the pair of bit lines BL, /BL, the column selection gate 33, and the pair of data input/output lines IO, /IO.

The writing circuit 38 sets one of the pair of data input/output lines IO, /IO to be at the "H" level and sets the other to be at the "L" level in accordance with the data DI given from the outside, so as to write data DI into an activated memory cell MC. When the word line WL and the column selection line CSL are lowered to the "L" level, i.e. the non-selected level, the data are stored into the memory cell MC.

In a reading operation, the column selection line CSL of the column corresponding to the column address signal is raised to the "H" level, i.e. the selected level, by the column decoder 37, and each memory cell MC in the selected column is connected to the reading circuit 39 via the pair of bit lines BL, /BL, the column selection gate 33, and the pair of data input/output lines IO, /IO. Subsequently, the word line WL of the row corresponding to the row address signal is raised to the "H" level, i.e. the selected level, by the row decoder 34, so as to activate each memory cell MC in the row. This allows electric currents to flow from one of the pair of bit lines BL, /BL to the memory cell MC in accordance with the data stored in the memory cell MC selected by the decoders 37, 34, whereby the potential of one of the pair of data input/output lines IO, /IO goes down. The reading circuit 39 compares the potentials of the data input/output lines IO, /IO, and outputs data DO to the outside in accordance with the comparison results.

FIG. 11A is a circuit diagram illustrating a construction of a memory cell MC. Referring to FIG. 11A, the memory cell MC includes load transistors (P-channel MOS transistors) 41, 42, driver transistors (N-channel MOS transistors) 43, 44, and access transistors (N-channel MOS transistors) 45, 46. The P-channel MOS transistors 41, 42 are respectively connected between the memory cell power source line MVL and storage nodes N1, N2, and the gates of the P-channel MOS transistors 41, 42 are respectively connected to the nodes N2, N1. The power source potential VDD is supplied to the memory cell power source line MVL. The N-channel MOS transistors 43, 44 are respectively connected between the storage nodes N1, N2 and a memory cell ground line MGL, and the gates of the N-channel MOS transistors 43, 44 are respectively connected to the nodes N2, N1. The N-channel MOS transistors 45, 46 are respectively connected between the storage nodes N1, N2, and the bit lines BL, /BL, and the gates of the N-channel MOS transistors 45, 46 are both connected to the word line WL.

In a writing operation, one of the bit lines BL, /BL is set to be at the "H" level and the other is set to be at the "L" level in accordance with the writing data DI. Subsequently, the word line WL is set to be at the "H" level, i.e. the selected level, whereby the N-channel MOS transistors 45, 46 become electrically conducted, and the levels of the bit lines BL, /BL are respectively given to the storage nodes N1, N2. When the "H" level and the "L" level are respectively given to the storage nodes N1, N2, the MOS transistors 41, 44 become electrically conducted, and the MOS transistors 42, 43 become electrically non-conducted, whereby the levels of the storage nodes N1, N2 are latched by the MOS transistors 41 to 44. Further, when the "L" level and the "H" level are respectively given to the storage nodes N1, N2, the MOS transistors 42, 43 become electrically conducted, and the MOS transistors 41, 44 become electrically non-conducted, whereby the levels of the storage nodes N1, N2 are latched by the MOS transistors 41 to 44. When the word line WL is set to be at the "L" level, i.e. the non-selected level, the N-channel MOS transistors 45, 46 become electrically non-conducted, whereby the levels of the storage nodes N1, N2 are maintained.

In a reading operation, each of the bit lines BL, /BL is charged to the "H" level by the bit line loads 31, 32 of FIG. 10. When the word line WL is set to be at the "H" level, i.e. the selected level, the N-channel MOS transistors 45, 46 become electrically conducted. In the case where the "H" level and the "L" level are respectively latched in the storage nodes N1, N2, electric currents flow out from the bit line /BL to the memory cell ground line MGL via the N-channel MOS transistors 46, 44, whereby the bit lines BL, /BL are respectively brought to the "H" level and the "L" level. In the case where the "L" level and the "H" level are respectively latched in the storage nodes N1, N2, electric currents flow out from the bit line BL to the memory cell ground line MGL via the N-channel MOS transistors 45, 43, whereby the bit lines BL, /BL are respectively brought to the "L" level and the "H" level. By comparing the levels of the bit lines BL and /BL, the data stored in the memory cell MC are read out. When the word line WL is set to be at the "L" level, i.e. the non-selected level, the N-channel MOS transistors 45, 46 become electrically non-conducted, and the operation of reading the data is ended.

FIG. 11B is a view illustrating a layout of the memory cell. On the surface of a silicon substrate, two gate electrodes GE1, GE2 are formed in parallel to extend in a Y-direction in FIG. 11B, and a word line WL is formed to extend in an X-direction in FIG. 11B. The gate electrodes GE1, GE2 and the word line WL are formed of a polysilicon layer. P-type active layers PA1, PA2 are respectively formed from one side to the other side at one end of the gate electrodes GE1, GE2. An N-type active layer NA1 is formed from one side to the other side at the other end of the gate electrode GE1 and from one side to the other side at one end of the word line WL. An N-type active layer NA2 is formed from one side to the other side at the other end of the gate electrode GE2 and from one side to the other side at the other end of the word line WL.

The P-type active layer PA1 together with the gate electrode GE1 and the P-type active layer PA2 together with the gate electrode GE2 respectively form P-channel MOS transistors 41, 42. The N-type active layer NA1 together with the gate electrode GE1 and the N-type active layer NA2 together with the gate electrode GE2 respectively form N-channel MOS transistors 43, 44. The N-type active layer NA1 together with the word line WL and the N-type active layer NA1 together with the word line WL respectively form N-channel MOS transistors 45, 46.

Next, a plurality of local wiring lines LL are formed. In FIG. 11B, the local wiring lines LL and the active layers are in a conducted state in the part where the local lines LL overlap with the active layers. The active layers PA1, PA2 at one end (the source of the P-channel MOS transistors 41, 42) are both connected to the memory cell power source line MVL. The memory cell power source line MVL is constructed with the local wiring line LL1.

The other end of the P-type active layer PA1 (the drain of the P-channel MOS transistor 41) is connected to a central part of the N-type active layer NA1 (the drain of the N-channel MOS transistors 43, 45) via the local wiring line LL2. The other end of the P-type active layer PA2 (the drain of the P-channel MOS transistor 42) is connected to a central part of the N-type active layer NA2 (the drain of the N-channel MOS transistors 44, 46) via the local wiring line LL3. The local wiring lines LL2, LL3 are respectively connected to the gate electrodes GE2, GE1, via contact holes CH, CH.

Further, bit lines BL, /BL and memory cell ground lines MGL, MGL are formed with a first aluminum wiring layer in parallel to extend in a Y-direction of FIG. 11B. The N-type active layers NA1, NA2 at one end (the source of the N-channel MOS transistors 43, 44) are respectively connected to the memory cell ground lines MGL, MGL via contact holes CH, CH. The N-type active layers NA1, NA2 at the other end (the drain of the N-channel MOS transistors 45, 46) are respectively connected to the bit lines BL, /BL via contact holes CH, CH.

The substrate of the memory cell MC is formed to have a triple well structure, as illustrated in FIGS. 12A and 12B. Namely, an $N^+$-type buried layer 48 is formed on the surface of a P-type silicon substrate 47, and a plurality (three in FIGS. 12A and 12B) of N-type wells NW are formed on the surface thereof. Two P-type wells PW are respectively formed between the three N-type wells NW. Each memory cell is formed on the surface of an N-type well NW and a P-type well PW that are adjacent to each other. The P-type active layers PA1, PA2 shown in FIG. 11B are formed on the surface of the N-type well NW, and the N-type active layers NA1, NA2 are formed on the surface of the P-type well PW. In FIGS. 12A and 12B, sixteen memory cells MC arranged in four rows and four columns are shown. In the triple well structure, soft errors are restrained from occurring, since electron-hole pairs generated in the P-type silicon substrate 47 are trapped by the $N^+$-type buried layer.

In such a SRAM, foreign substances may possibly adhere to memory cells MC during the production to cause (1) short circuit between the storage nodes N1, N2, (2) short circuit between the node N1 or N2 and the memory cell power source line MVL, (3) short circuit between the storage node N1 or N2 and the memory cell ground line MGL, (4) short circuit between the storage node N1 or N2 and the word line WL, (5) short circuit between the storage node N1 or N2 and the bit line BL or /BL, (6) short circuit between the bit line BL or /BL and the word line WL, (7) short circuit between the word line WL and the memory cell power source line MVL, (8) short circuit between the bit line BL or /BL and the memory cell ground line MGL, or (9) short circuit between the memory cell power source line MVL and the memory cell ground line MGL. In the memory cell MC shown in FIG. 11, the short circuit of (8) are especially liable to occur, since the bit lines BL, /BL and the memory cell ground lines MGL, MGL are arranged in parallel and adjacent to each other.

The memory cell MC in which such a short circuit has occurred does not operate properly. Therefore, in an SRAM, a redundancy system is adopted in which the SRAM is provided with a spare row or column for replacing the row or column that includes a defective memory cell MC and a program circuit for programming the address of the defective row or column, whereby the spare row or column is selected instead of the defective row or column when the address of the defective row or column is input, so as to relieve the defective product.

However, by simply replacing the defective row or column with a spare row or column, leakage currents continue to flow through the short-circuited part, whereby the standby electric currents go beyond a reference value. Therefore, various methods are proposed for reducing the standby electric current.

In a method shown in FIG. 13, a fuse 50 is provided in correspondence with each memory cell row. The fuse 50 is connected between the memory cell power source line MVL of the corresponding row and the line of the power source potential VDD', and is blown if the corresponding row is defective. When the fuse 50 is blown, the electric current flowing out from the line of the power source potential VDD' to the memory cell power source line MVL and the short-circuited part of the defective memory cell is shut off even in the presence of the short circuits of (1) to (4), (7), and (9), thereby reducing the standby electric current. Such a method is disclosed, for example, in Japanese Patent Laying-Open No. 07-230699.

However, this method raises a problem in that an insufficiently blown fuse 50 causes insufficient reduction of the standby electric current.

Further, FIG. 14 is a view illustrating in detail an SRAM to which the method shown in FIG. 13 is applied. Referring to FIG. 14, this SRAM includes a well power source line WVL and a well ground line WGL disposed for a plurality of columns (64 columns in FIG. 14). Each well power source line WVL receives a power source potential VDD and is connected to each N-type well NW of FIG. 12 via a contact hole CH. Each well ground line WGL receives a ground potential VSS and is connected to each P-type well PW of FIGS. 12A and 12B via a contact hole CH. This can prevent electric currents from flowing out from the active layer PA or NA of the MOS transistors to the well NW or PW. Each memory cell power source line MVL is connected to the line of the power source potential VDD' (VDD'=VDD) via a fuse 50. The pad for the power source potential VDD' and the pad for the power source potential VDD are separately provided. This is for facilitating the analysis of deficiency in the standby electric current.

However, this SRAM involves a problem of being weak against the latch-up. In other words, referring to FIGS. 15A and 15B, the N-type well NW and the P-type well PW respectively constitute resistor elements 51, 52. Since the distance between the well power source lines WVL, WVL and the distance between the well ground lines WGL, WGL are long in this SRAM as shown in FIG. 14, the resistance value of each of the resistor elements 51, 52 is large. Further, the P-type active layer PA1 of the P-channel MOS transistor 41 together with the N-type well NW and the P-type well PW constitute a PNP bipolar transistor 53, and the N-type active layer NA1 of the N-channel MOS transistor 43 together with the N-type well NW and the P-type well PW constitute an NPN bipolar transistor 54.

If for some reason a latch-up trigger is generated in the N-type well or the P-type well to set the potential between the base and the emitter of the transistors 53, 54 to be in a forward bias, the collector electric current of the transistor 53 flows into the resistor element 52 (P-type well PW) to increase the forward bias potential between the base and the emitter of the transistor 54, and also the collector electric current of the transistor 54 increases the forward bias potential between the base and the emitter of the transistor 53. This causes a large electric current to flow from the lines of the power source potentials VDD, VDD' to the line of the ground potential VSS to destroy the SRAM. Here, since the resistance value of the fuse 50 has a small value of not more than 10 Ω, the electric current flowing through the transistor 53 is not limited by the fuse 50.

Further, in the method of FIG. 16, a program circuit 60 and a power source potential supplying circuit 66 are provided in correspondence with each memory cell row. The program circuit 60 includes a fuse 61, N-channel MOS transistors 62, 63, a P-channel MOS transistor 64, and a capacitor 65. The fuse 61 and the N-channel MOS transistor 62 as well as the MOS transistors 64, 63 are connected in series between the line of the power source potential VDD and the line of the ground potential VSS. The gates of the MOS transistors 64, 63 are both connected to a node N61 between the fuse 61 and the N-channel MOS transistor 62. A signal appearing at this node N61 will be an output signal φE of this program circuit 60. The gate of the N-channel MOS transistor 62 is connected to the drain of the N-channel MOS transistor 63 (node N63). The capacitor 65 is connected between the line of the power source potential VDD and the node N63. The power source potential supplying circuit 66 includes inverters 67 of even number of stages (two stages in FIG. 16) that are connected in series between the output node N61 of the program circuit 60 and the corresponding memory cell power source line MVL.

In the case where the fuse 61 has not been blown, the power source potential VDD is given to the node N61 via the fuse 61, and the signal φE is brought to the "H" level to give the power source potential VDD to the memory cell power source line MVL. In the case where the fuse 61 has been blown, the power source potential VDD is given to the node N63 via the capacitor 65 when the power is turned on, whereby the MOS transistors 62, 64 become electrically conducted, the MOS transistor 63 becomes electrically non-conducted, and the signal ΦE is brought to the "L" level to ground the memory cell power source line MVL. Therefore, the standby electric current is reduced even in the presence of the short circuits of (1) to (4), (7), and (9). Such a method is disclosed, for example, in Japanese Patent Laying-Open No. 07-230699.

However, this method involves a problem in that, if the fuse 61 has been insufficiently blown, the standby electric current cannot be reduced, since the signal φE is brought to the "H" level to give the power source potential VDD to the memory cell power source line MVL.

Further, since the memory cell power source line MVL of the defective row is fixed at the ground potential VSS, a poor standby electric current will be generated if the signal line of the signal set at the "H" level at the standby time and the memory cell power source line MVL set at the ground potential VSS are short-circuited.

Further, in the method shown in FIG. 17, a fuse 70 is provided in correspondence with each memory cell column. The fuse 70 is inserted between the line of the power source potential VDD and the source of the P-channel MOS transistors 31, 32, and is blown if the corresponding column is found to be defective. When the fuse 70 is blown, the standby electric current is reduced because the electric current flowing from the line of the power source potential VDD to the short-circuited part of the defective memory cell via the P-channel MOS transistors 31, 32 and the pair of bit lines BL, /BL is shut off even in the presence of the short-circuits of (5), (6), and (8).

However, even this method involves a problem in that an insufficiently blown fuse 70 causes insufficient reduction of the standby electric current.

Further, in the method shown in FIG. 18, the gates of the P-channel MOS transistors 31, 32 receive the signal ΦE in lieu of the ground potential VSS. At the standby time, the signal ΦE is brought to the "H" level, i.e. a non-activated level, whereby the P-channel MOS transistors 31, 32 become electrically non-conducted. Therefore, the standby electric current is reduced because the electric current flowing from the line of the power source potential VDD to the short-circuited part of the memory cell MC via the P-channel MOS transistors 31, 32 and the pair of bit lines BL, /BL is shut off even in the presence of the short-circuits of (5), (6), and (8). At the active time, the signal φE is brought to the "L" level, i.e. an activated level, whereby the P-channel MOS transistors 31, 32 become electrically conducted, thereby leading to the same state as the SRAM shown in FIG. 10.

However, this method raises a problem in that, since each of the pair of bit lines BL, /BL is set to be in a floating state at the standby time, it requires a period of time to charge each of the pair of bit lines BL, /BL to the "H" level when the mode is transferred from the standby mode to the reading mode, whereby the reading speed is delayed.

Further, the methods shown in FIGS. 13 to 18 involve a problem in that even if the standby electric current can be reduced in the presence of some of the short-circuits of (1) to (9), the standby electric current cannot be reduced in the presence of another short-circuit. For example, in the method shown in FIG. 13, although the standby electric current can be reduced in the presence of the short-circuits of (1) to (4), (7), and (9), the standby electric current cannot be reduced in the presence of the short-circuit of (6), because the electric current leaks out from the bit lines BL, /BL at the "H" level to the word line WL at the "L" level. Further, in the method shown in FIG. 17, although the standby electric current can be reduced in the presence of the short-circuits of (5), (6), and (8), the standby electric current cannot be reduced in the presence of the short-circuit of (1) to (4), (7), and (9), because the electric current leaks out from the memory cell power source line MVL to the line of the ground potential VSS.

SUMMARY OF THE INVENTION

Therefore, a principal object of the present invention is to provide a static type semiconductor memory device with reduced standby electric current and being strong against the latch-up.

A static type semiconductor memory device according to the present invention comprises a first switching element which is provided corresponding to each word line and which is connected between the corresponding word line and a line of a reference potential for setting the corresponding memory cells to be in a non-activated state by becoming electrically conducted when the corresponding word line is not selected, a power source line which is provided corresponding to each row or column and whose one end is connected to a power source node of each memory cell in the corresponding row or column, a second switching element which is provided corresponding to each power source line and which is connected between the other end of the corresponding power source line and a line of a power source potential, the second switching element having a predetermined conduction resistance value larger than a conduction resistance value of the first switching element, and a program circuit which is provided corresponding to each row or column and which includes a fuse that is blown when the corresponding row or column is defective, the program circuit letting the second switching element become electrically non-conducted according as the fuse is blown.

Therefore, by cutting the fuse of the program circuit corresponding to a defective row or column, the power source line of the row or column can be set to be in a floating state by letting the second switching element become electrically non-conducted. As a result, it is possible to prevent leakage of electric currents to a short-circuited part of the memory cells and electric currents flowing between the power source line and the signal line, thereby reducing the standby electric currents. Further, since the second switching element has a predetermined conduction resistance value larger than the conduction resistance value of the first switching element, it is possible to detect a short-circuit of the power source line to the word line or the like and, by setting the power source line to be in a floating state, the standby electric currents can be reduced. Further, since the second switching element has a comparatively large predetermined conduction resistance value, the leakage electric currents can be restrained even if a latch-up phenomenon occurs.

Preferably, the power source line and the program circuit are provided corresponding to each column; the static type semiconductor memory device further comprises a bit line load element which is provided corresponding to each bit line and whose one electrode is connected to the corresponding bit line, and a third switching element which is provided corresponding to each column and which is connected between the other electrode of each bit line load element of the corresponding column and a line of a power source potential; and the program circuit lets the third switching element as well as the second switching element become electrically non-conducted according as the fuse is blown. In this case, by cutting one fuse corresponding to the defective column, the electric currents flowing out from the power source line and the pair of bit line of the column can be shut off.

Preferably, the program circuit includes a fourth switching element which is connected between a first node and a line of a first potential and which becomes electrically conducted according as a reset signal changes from a first level to a second level for resetting a potential of the first node to the first potential, a fifth switching element which is connected in series with the fuse between the first node and a line of a second potential and which becomes electrically conducted according as the reset signal changes from the second level to the first level for setting the potential of the first node to the second potential when the fuse has not been blown, and a latch circuit which latches the potential of the first node according as a predetermined period of time has passed after the reset signal changed from the second level to the first level, for letting the second switching element become electrically non-conducted when the latched potential is the first potential. In this case, even if the fuse has been insufficiently blown, the same results can be obtained as in the case where the fuse has been sufficiently blown.

Preferably, the static type semiconductor memory device further comprises a semiconductor substrate of first conductivity type, a semiconductor buried layer of second conductivity type formed on a surface of the semiconductor substrate, a plurality of first wells of first conductivity type formed on a surface of the semiconductor buried layer, and a plurality of second wells of second conductivity type formed on a surface of the semiconductor buried layer between the plurality of first wells respectively, wherein the plurality of memory cells are formed on a surface of the plurality of first wells and the plurality of second wells. In this case, the electron-hole pairs generated in the semiconductor substrate are absorbed into the semiconductor buried layer, thereby restraining the generation of soft errors.

Preferably, the second switching element includes a transistor having the predetermined conduction resistance value. In this case, the second switching element can be constructed with ease.

Preferably, the second switching element includes a resistor element having the predetermined conduction resistance value, and a transistor which is connected in series with the resistor element between the other end of the power source line and the line of the power source potential. In this case, the conduction resistance value of the second switching element can be set with ease and with accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
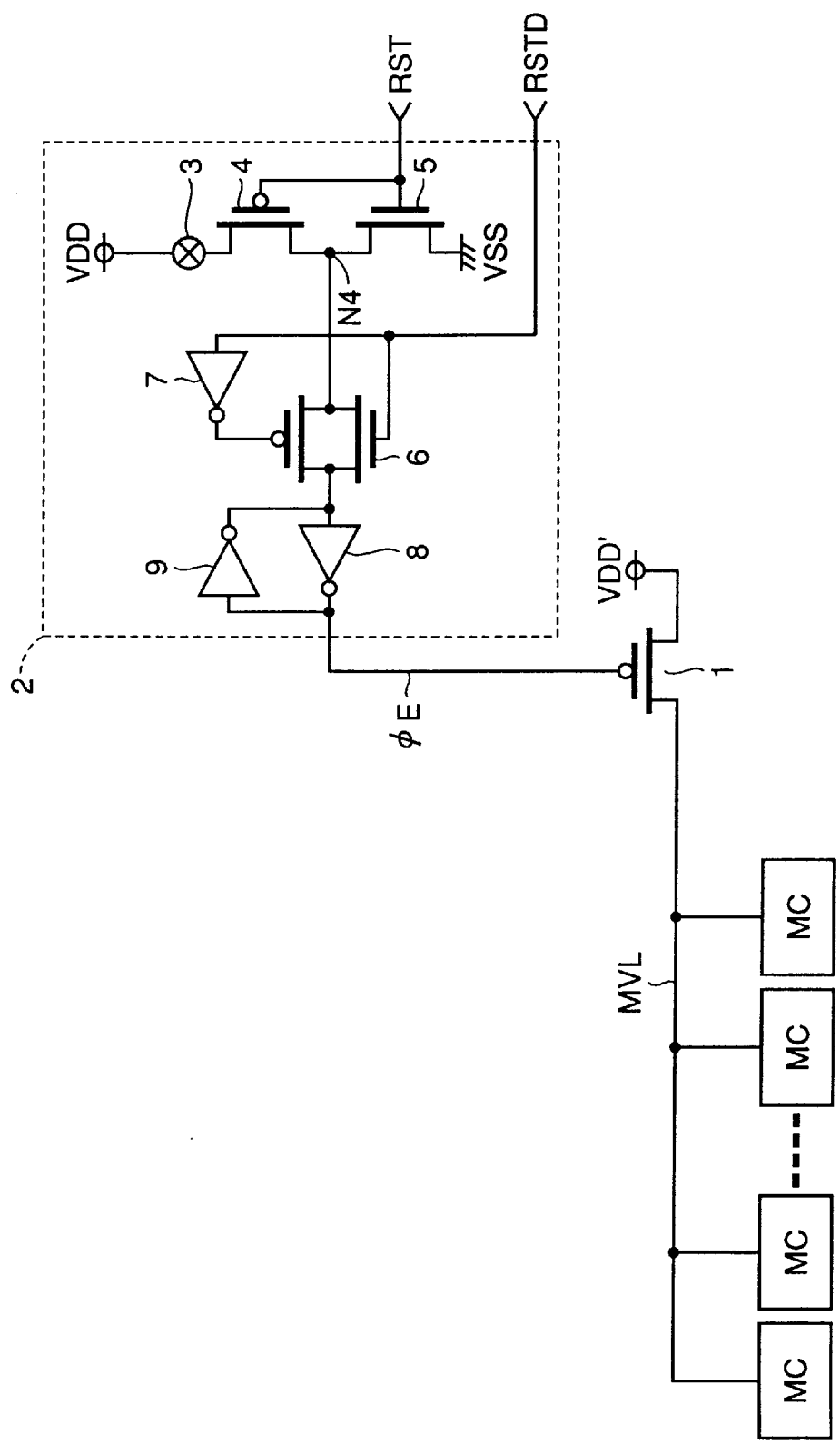
FIG. 1 is a circuit block diagram illustrating an essential part of a SRAM according to a first embodiment of the present invention.
Figure 13:
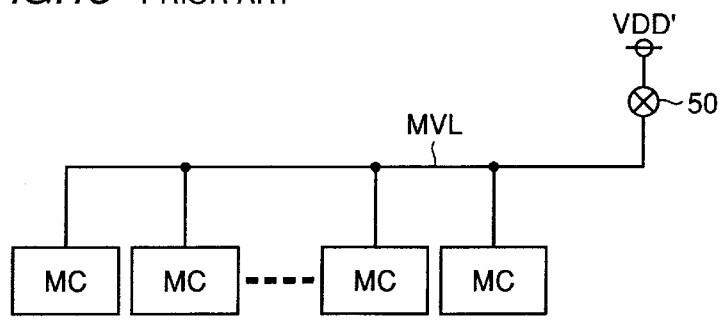
FIG. 13 is a circuit block diagram illustrating an essential part of another conventional SRAM.

FIG. 1 is a circuit block diagram illustrating an essential part of a SRAM according to the first embodiment of the present invention, and is a view compared with FIG. 13.

Referring to FIG. 1, the difference of this SRAM from the SRAM of FIG. 13 lies in that the fuse 50 is replaced with a P-channel MOS transistor 1 and a program circuit 2. The P-channel MOS transistor 1 is connected between the line of the power source potential VDD' and the corresponding memory cell power source line MVL, and the gate of the P-channel MOS transistor 1 receives an output signal ΦE of the program circuit 2. The P-channel MOS transistor 1 has a comparatively large predetermined conduction resistance value (larger than about 10 KΩ).

The program circuit 2 includes a fuse 3, a P-channel MOS transistor 4, an N-channel MOS transistor 5, a transfer gate 6, and inverters 7 to 9. The fuse 3, the P-channel MOS transistor 4, and the N-channel MOS transistor 5 are connected in series between the line of the power source potential VDD and the line of the ground potential VSS. The gates of the P-channel MOS transistor 4 and the N-channel MOS transistor 5 receive a reset signal RST. The reset signal RST is, for example, a signal that is brought to the "H" level for a predetermined period of time of T1 when the power is turned on.

The transfer gate 6 and the inverter 8 are connected in series between the node N4, which is located between the MOS transistors 4, 5, and the gate of the P-channel MOS transistor 1. A signal RSTD is directly input into the gate of the transfer gate 6 on the N-channel MOS transistor side, and is input into the gate on the P-channel MOS transistor side via the inverter 7. The signal RSTD is a signal that is obtained by delaying the reset signal RST by a predetermined period of time of T2. The inverter 9 is connected reversely in parallel with the inverter 8. The transfer gate 6 and the inverters 7 to 9 constitute a latch circuit.

Figure 2:
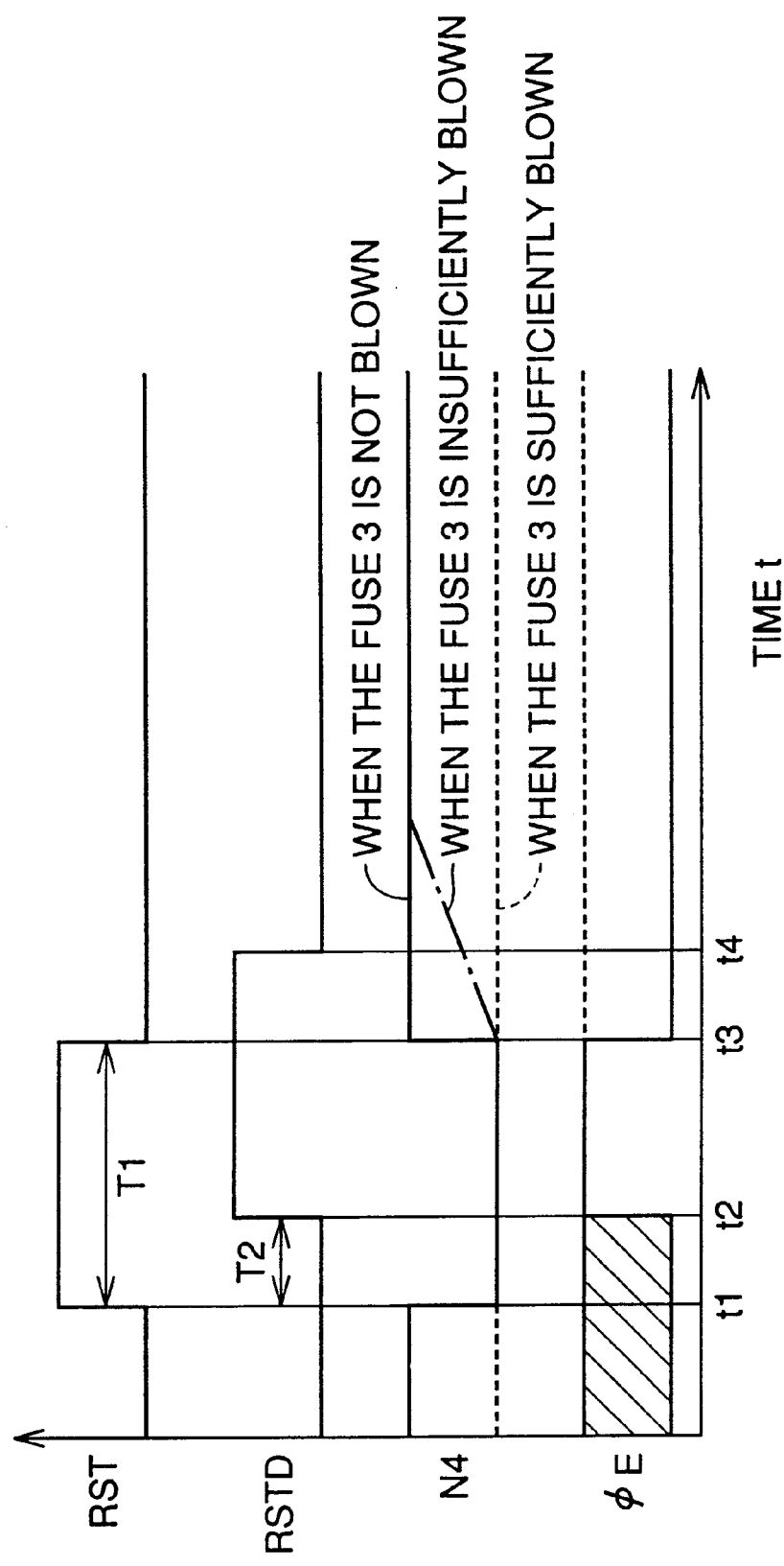
FIG. 2 is a time chart illustrating an operation of a program circuit shown in FIG. 1.

FIG. 2 is a time chart illustrating an operation of the program circuit 2 shown in FIG. 1. Referring to FIG. 2, in an initial state, the signals RST, RSTD are both at the "L" level, whereby the P-channel MOS transistor 4 is electrically conducted, and the N-channel MOS transistor 5 and the transfer gate 6 are electrically non-conducted. When the reset signal RST is raised from the "L" level to the "H" level at some time t1, the P-channel MOS transistor 4 becomes electrically non-conducted, and the N-channel MOS transistor 5 becomes electrically conducted, whereby the node N4 is reset to the "L" level.

Subsequently, when the signal RSTD is raised from the "L" level to the "H" level at the time t2, the transfer gate 6 becomes electrically conducted, whereby the signal BE is reset to the "H" level. Next, when the signal RST is lowered from the "H" level to the "L" level at the time t3, the P-channel transistor 4 becomes electrically conducted, and the N-channel MOS transistor 5 becomes electrically non-conducted.

At this time, if the fuse 3 has not been blown, the power source potential VDD is given to the node N4 via the fuse 3 and the P-channel MOS transistor 4, whereby the node N4 is raised from the "L" level to the "H" level, and the signal ΦE is lowered from the "H" level to the "L" level. Further, if the fuse 3 has been sufficiently blown, the node N4 remains at the "L" level without change, and the signal ΦE remains at the "H" level without change. If the fuse 3 has been insufficiently blown, the potential of the node N4 gradually rises, since the insufficiently blown fuse 3 has a high resistance value, and it requires a long period of time till the potential of the node N4 exceeds the threshold potential of the inverter 8. The signal φE remains at the "H" level without change until the potential of the node N4 exceeds the threshold potential of the inverter 8. Subsequently, when the signal RSTD is lowered from the "H" level to the "L" level at the time t4, the transfer gate 6 becomes electrically non-conducted, and the level of the signal φE is latched by the inverters 8, 9.

Therefore, if the fuse 3 has not been blown, the signal φE is brought to the "L" level, while if the fuse 3 has been sufficiently blown or if the fuse 3 has been insufficiently blown, the signal φE is brought to the "H" level.

Next, a method of using this SRAM will be described. First, a test is carried out to examine whether each memory cell MC is proper or not, and the memory cell row including a defective memory cell MC is replaced with a spare memory cell row, and the fuse 3 of the program circuit 2 corresponding to the memory cell row including the defective memory cell MC is blown.

In the memory cell row where the fuse 3 has not been blown, the output signal φE of the program circuit 2 is brought to the "L" level to let the P-channel MOS transistor 1 become electrically conducted. This allows the power source potential VDD' to be given to the memory cell power source line MVL of the row from the line of the power source potential VDD' via the P-channel MOS transistor 1, and the memory cell row operates properly.

In contrast, in the memory cell row where the fuse 3 has been sufficiently blown or in the memory cell row where the fuse 3 has been insufficiently blown, the output signal φE of the program circuit 2 is brought to the "H" level to let the P-channel-MOS transistor 1 become electrically non-conducted. This allows the memory cell power source line MVL of the row to be in a floating state and, even if a short-circuited part is present in a memory cell MC of the row, electric currents do not flow through the short-circuited part. Therefore, the standby electric current can be reduced.

Figure 16:
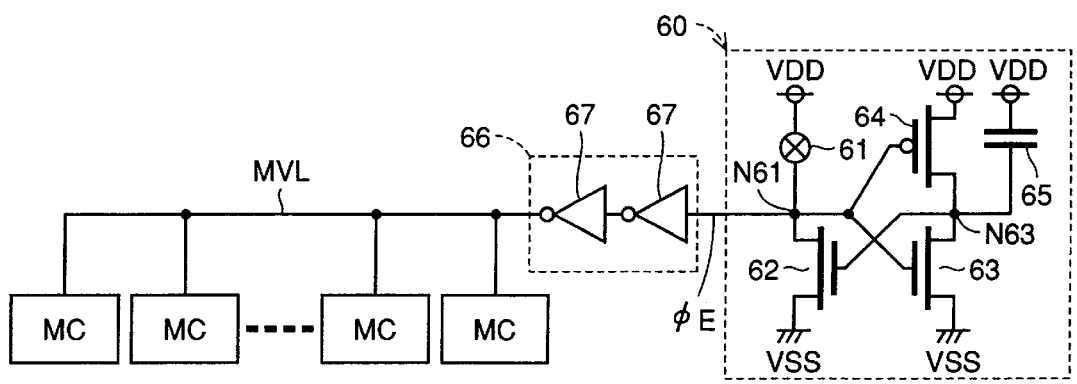
FIG. 16 is a circuit block diagram illustrating an essential part of still another conventional SRAM.
Figure 17:
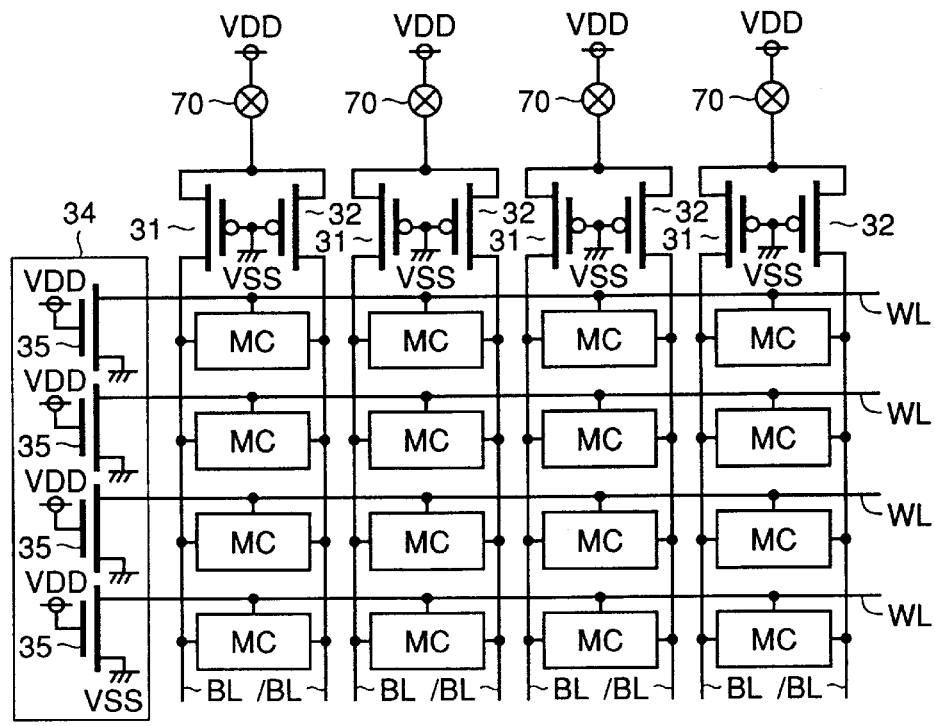
FIG. 17 is a circuit block diagram illustrating an essential part of still another conventional SRAM.
Figure 18:
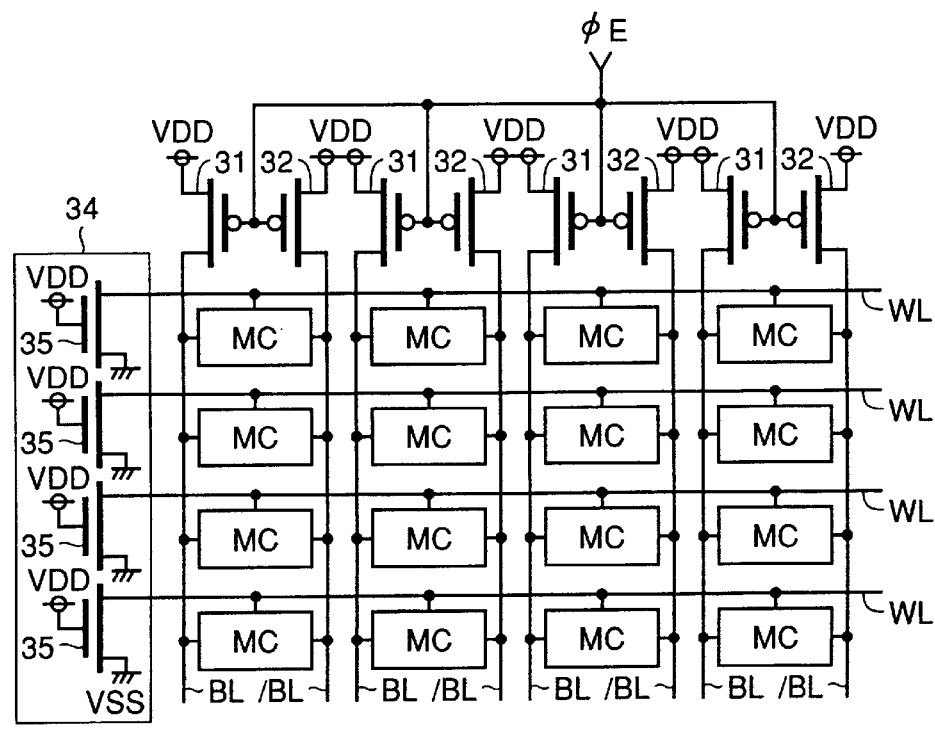
FIG. 18 is a circuit block diagram illustrating an essential part of still another conventional SRAM.

Also, the memory cell power source line MVL of the defective memory cell row is set to be in the floating state instead of being grounded as in the case of the SRAM shown in FIG. 16. Therefore, even if the signal line for transmitting the signal that is brought to the "H" level at the standby time is short-circuited to the memory cell power source line MVL, the electric currents do not flow between the signal line and the memory cell power source line MVL, thereby reducing the standby electric current.

Figure 3:
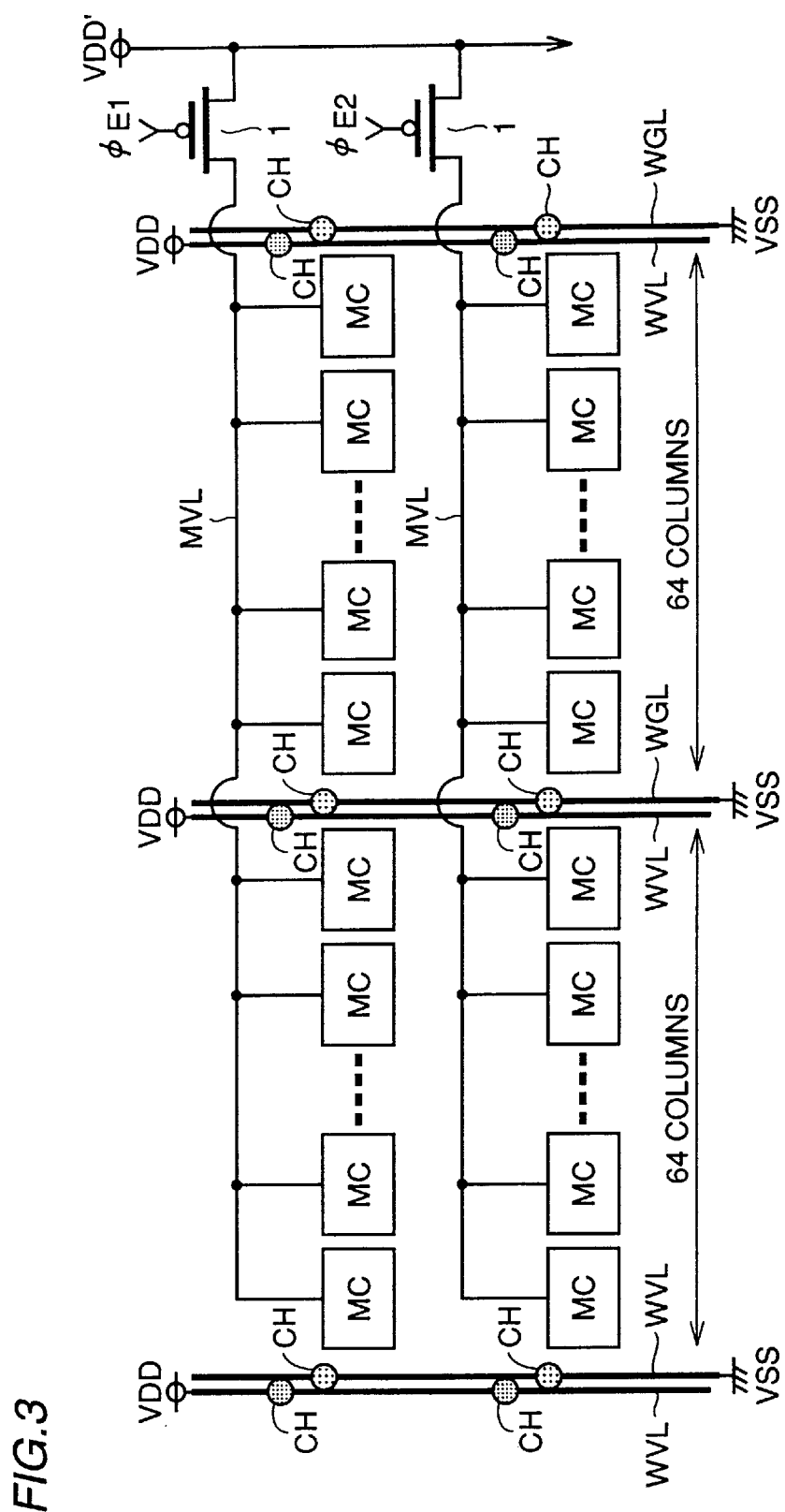
FIG. 3 is a circuit block diagram illustrating the SRAM described in FIG. 1 in more detail.
Figure 14:
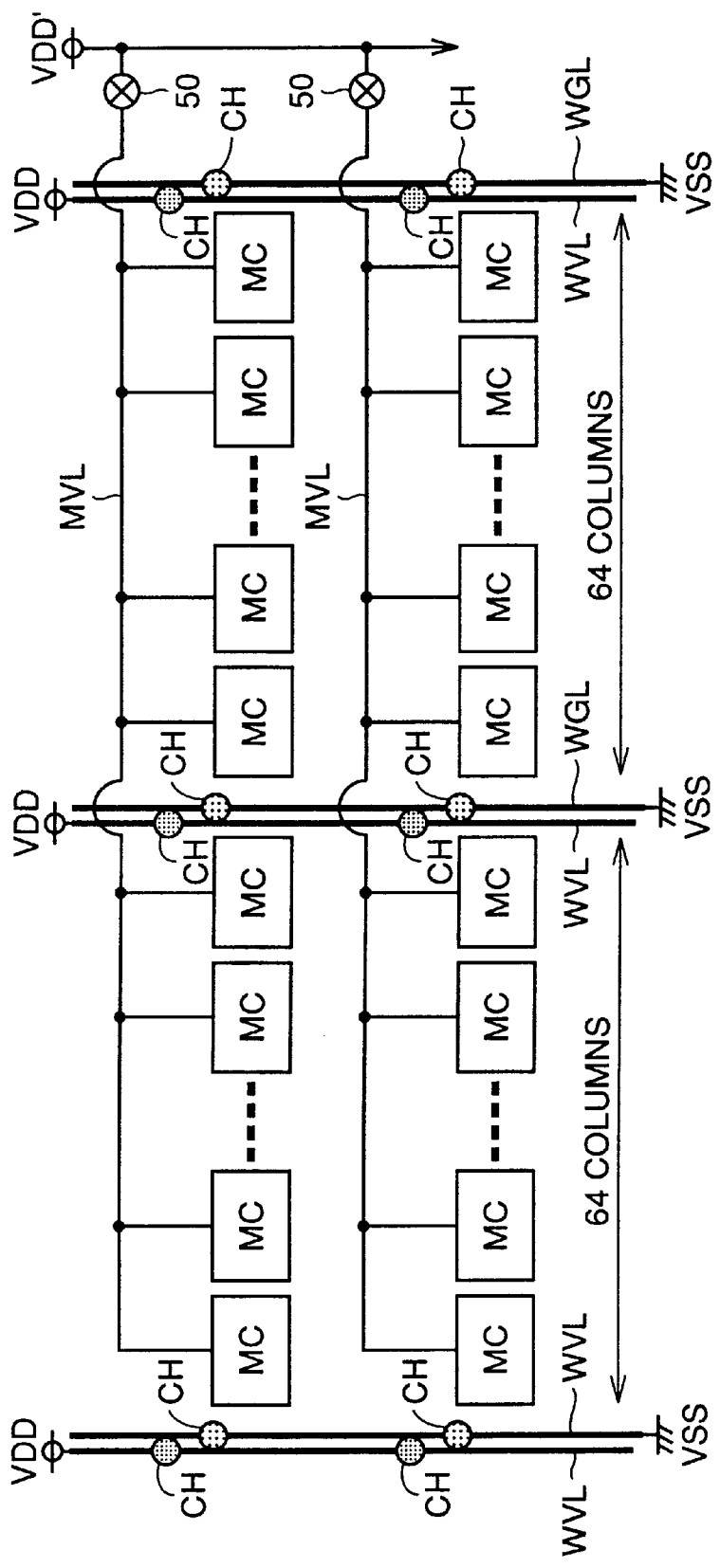
FIG. 14 is a circuit block diagram illustrating the SRAM shown in FIG. 13 in more detail.

Also, FIG. 3 is a view illustrating the construction of this SRAM in detail, and is a view to be compared with FIG. 14. Referring to FIG. 3, the difference of this SRAM from the SRAM of FIG. 14 lies in that each fuse 50 is replaced with a P-channel MOS transistor 1, and a program circuit 2 shown in FIG. 1 is provided in correspondence with each memory cell row. In FIG. 3, only two memory cell rows are shown for simplification of the drawings. The output signals φE1, φE2 of the two program circuits 2 (not illustrated) are respectively input into the gates of the P-channel MOS transistors 1, 1 of the two memory cell rows.

Figure 4:
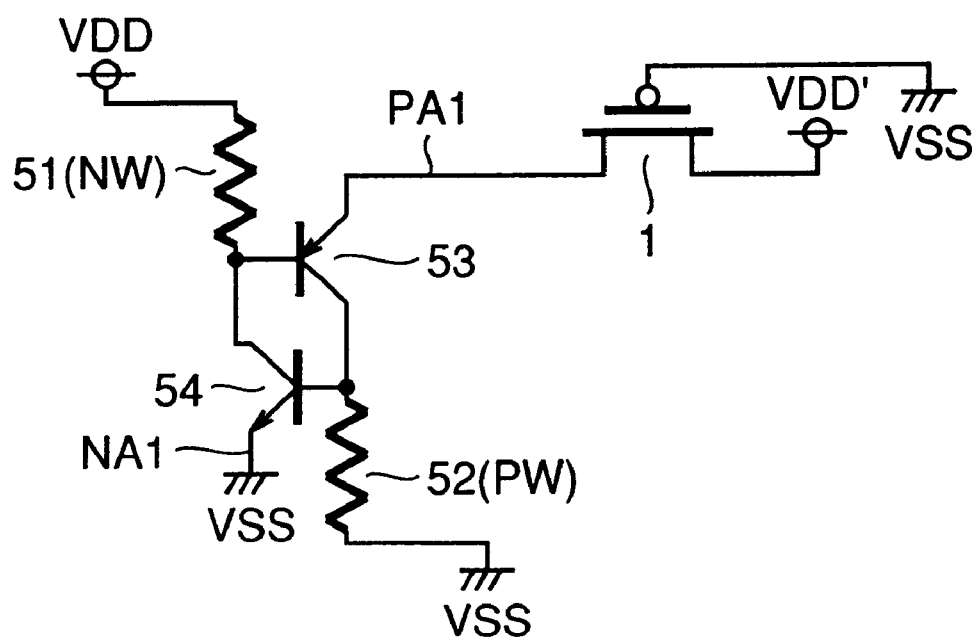
FIG. 4 is a circuit diagram for describing an effect of the SRAM shown in FIG. 3.
Figure 15A:
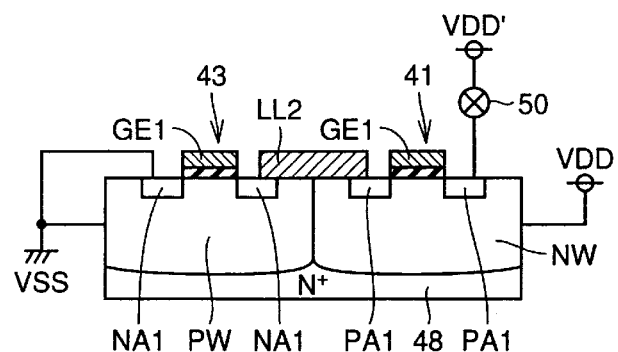
FIGS. 15A and 15B are views for describing problems of the SRAM shown in FIG. 14.
Figure 15B:
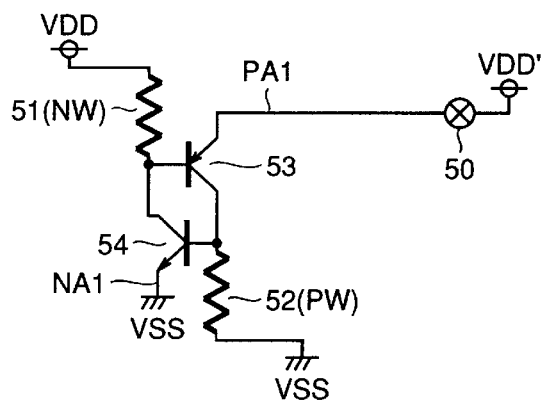

This SRAM has a construction which is strong against the latch-up. Namely, in this SRAM also, the wells NW, PW and the active layers PA, NA constitute a discharging circuit made of resistor elements 51, 52 and bipolar transistors 53, 54, as described in FIG. 15B. However, in this SRAM, a P-channel MOS transistor 1 having a high conduction resistance value is connected between the line of the power source potential VDD' and the emitter of the NPN bipolar transistor 53, as illustrated in FIG. 4. Therefore, even if a latch-up phenomenon occurs, the electric current flowing from the line of the power source potential VDD' to the line of the ground potential VSS is limited to a small value by the P-channel MOS transistor 1. For example, assuming the power source potential VDD' to be 4 V, the resistance value of the fuse 50 to be 10 Ω, and the conduction resistance value of the P-channel MOS transistor 1 to be 10 Ω, an electric current of 400 mA flows in the circuit of FIG. 15B at the latch-up time, while an electric current of only 400 μA flows in the circuit of FIG. 4. Therefore, this SRAM can be assumed to have a construction that is stronger against the latch-up than the conventional SRAM.

Figure 5:
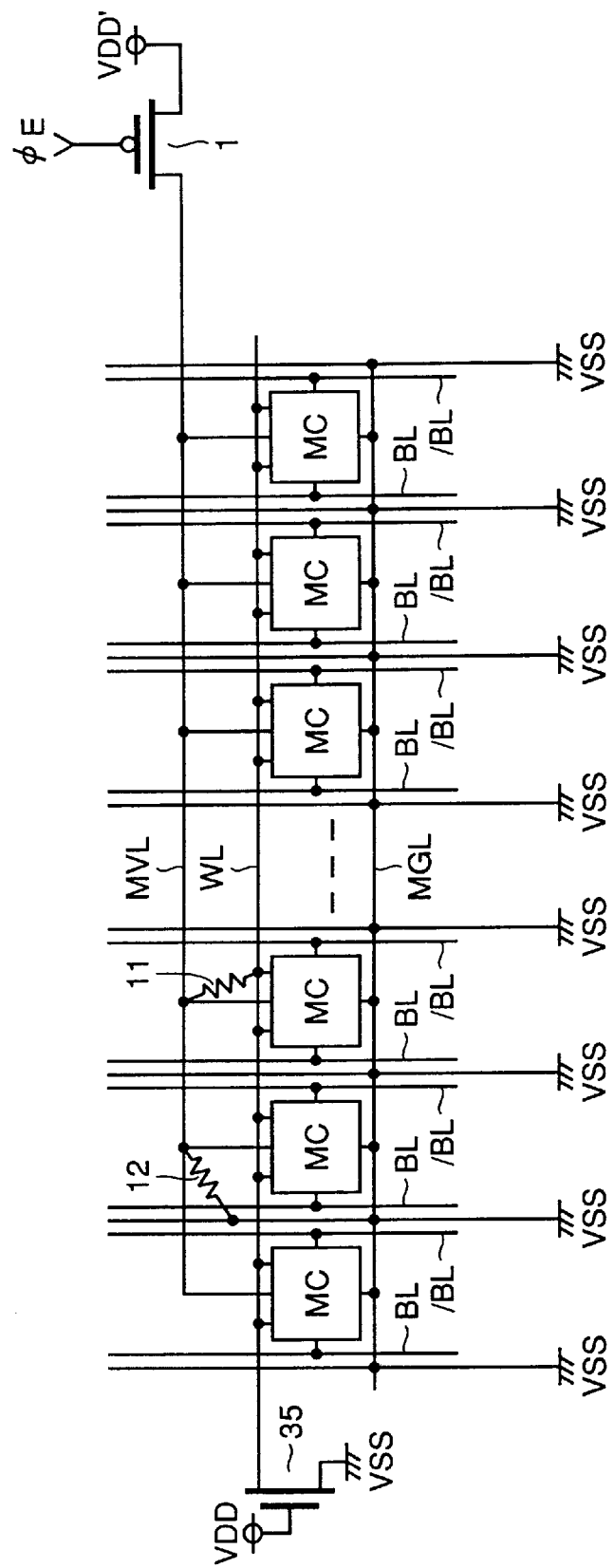
FIG. 5 is a circuit block diagram for describing an effect of the SRAM shown in FIG. 1.

Further, this SRAM has a construction that can easily detect short-circuits of (7) to (9). Namely, as illustrated in FIG. 5, consider the case of (7) in which the memory cell power source line MVL and the word line WL are short-circuited by a foreign substance 11 having a low resistance value (the foreign substance 12 will be described later). If the P-channel MOS transistor 1 and the N-channel MOS transistor 35 of the row decoder 34 (see FIG. 10) are in a conducted state, the potential of the memory cell power source line MVL will be a partial potential obtained by dividing the power source potential VDD' with the conduction resistance value of the P-channel MOS transistor 1 and the conduction resistance value of the N-channel MOS transistor 35. Here, the resistance value of the foreign substance 11 is assumed to be sufficiently lower than the conduction resistance value of the N-channel MOS transistor 35.

Therefore, in the case where the conduction resistance value of the P-channel MOS transistor 1 is sufficiently smaller than the conduction resistance value of the N-channel MOS transistor 35, the potential of the memory cell power source line MVL will be approximately the same as the power source potential VDD', so that a poor operation of the memory cells MC does not occur. For this reason, this memory cell row is judged to be proper by the test, and is not replaced with a spare memory cell row, so that the P-channel MOS transistor 1 is set to be in a conducted state. However, since an electric current leaks from the line of the power source potential VDD' to the line of the ground potential VSS via the P-channel MOS transistor 1, the memory cell power source line MVL, the foreign substance 11, the word line WL, and the N-channel MOS transistor 35, a poor standby electric current occurs.

However, in this SRAM of the present invention, since the conduction resistance value of the P-channel MOS transistor 1 is larger than the conduction resistance value of the N-channel MOS transistor 35, the potential of the memory cell power source line MVL will be less than half of the power source potential VDD', so that the memory cells do not operate properly. Therefore, this memory cell row is judged to be defective by the test, and is replaced with a spare memory cell row, and the P-channel MOS transistor 1 is let to become electrically non-conducted. Therefore, the electric current does not flow through the foreign substance 11, and the standby electric current is reduced.

Next, consider the case of (9) in which the memory cell power source line MVL and the memory cell ground line MGL are short-circuited by a foreign substance 12 having a low resistance value. If the P-channel MOS transistor 1 is electrically conducted, the potential of the memory cell power source line MVL will be a partial potential obtained by dividing the power source potential VDD' with the conduction resistance value of the P-channel MOS transistor 1 and the conduction resistance value of the foreign substance 12.

Therefore, in the case where the conduction resistance value of the P-channel MOS transistor 1 is sufficiently smaller than the conduction resistance value of the foreign substance 12, the potential of the memory cell power source line MVL will be approximately the same as the power source potential VDD', so that a poor operation of the memory cells MC does not occur. For this reason, this memory cell row is judged to be proper by the test, and is not replaced with a spare memory cell row, so that the P-channel MOS transistor 1 is set to be in a conducted state. Therefore, since an electric current leaks from the line of the power source potential VDD' to the line of the ground potential VSS via the P-channel MOS transistor 1, the memory cell power source line MVL, the foreign substance 12, and the memory cell ground line MGL, a poor standby electric current occurs.

However, in this SRAM of the present invention, the conduction resistance value of the P-channel MOS transistor 1 is set to be a comparatively high value. Therefore, if the resistance value of the foreign substance 12 is smaller than the conduction resistance value of the P-channel MOS transistor 1, the potential of the memory cell power source line MVL will be less than half of the power source potential VDD', so that the memory cells MC do not operate properly. Therefore, this memory cell row is judged to be defective by the test, and is replaced with a spare memory cell row, and the P-channel MOS transistor 1 is let to become electrically non-conducted. Therefore, the electric current does not flow through the foreign substance 12, and the standby electric current is reduced.

Figure 6:
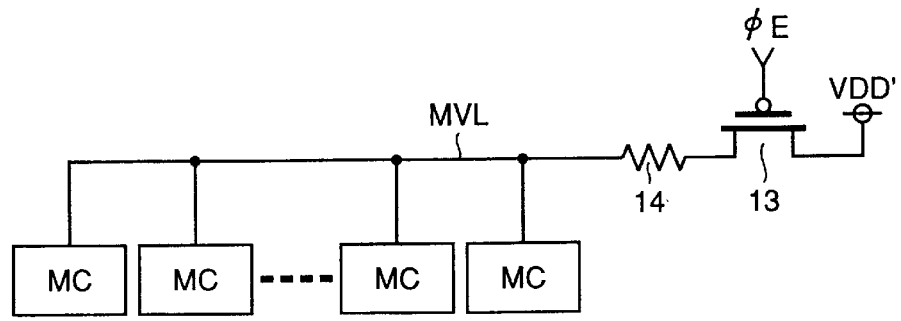
FIG. 6 is a circuit block diagram illustrating a modified example of the first embodiment.

Here, in this first embodiment, the P-channel MOS transistor 1 having a high conduction resistance value is connected between the line of the power source potential VDD' and the memory cell power source line MVL. However, the same effect may be obtained if a P-channel MOS transistor 13 having a low conduction resistance value and a resistor element 14 having a high resistance value (higher than about 10 KΩ) are connected in series between the line of the power source potential VDD' and the memory cell power source line MVL, as illustrated in FIG. 6. In this case, the resistance value between the line of the power source potential VDD' and the memory cell power source line MVL can be set with ease and with accuracy.

[Second Embodiment]

Figure 7:
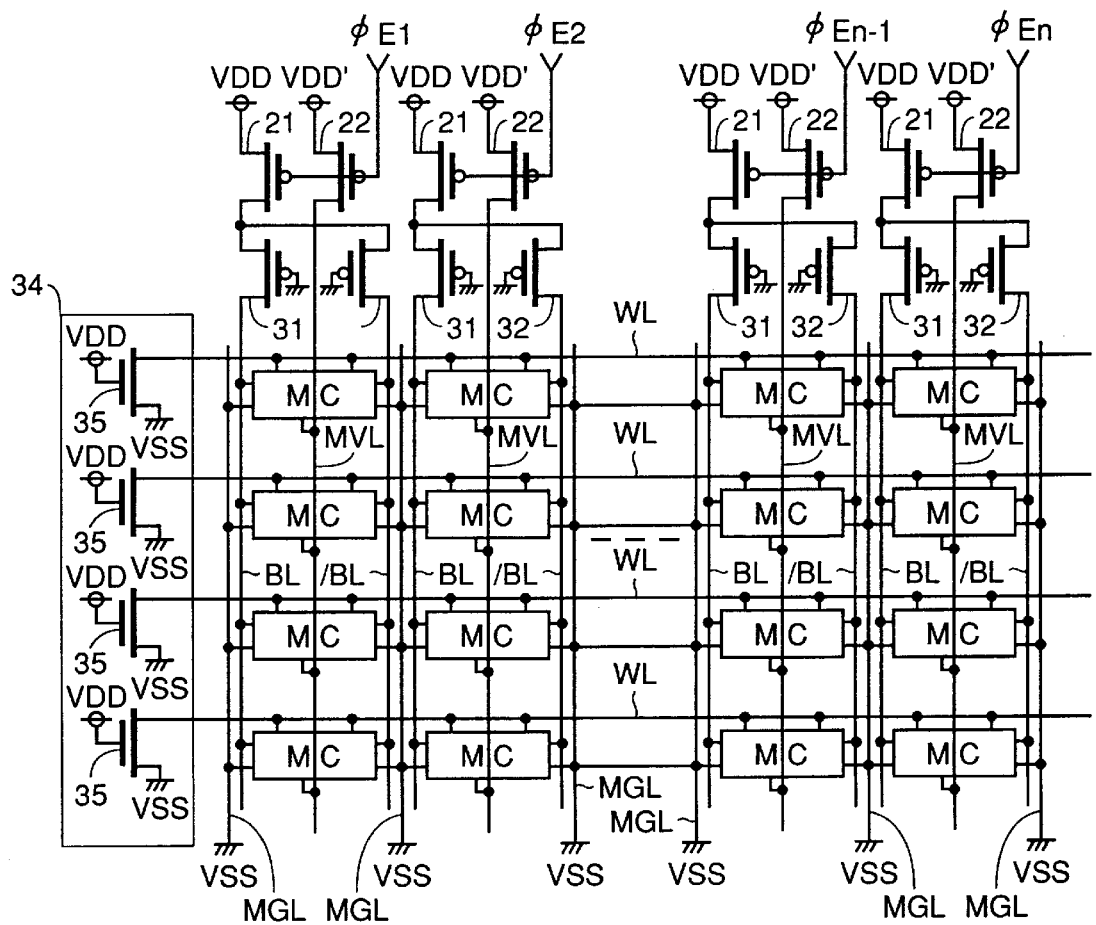
FIG. 7 is a circuit block diagram illustrating an essential part of a SRAM according to a second embodiment of the present invention.
Figure 10:
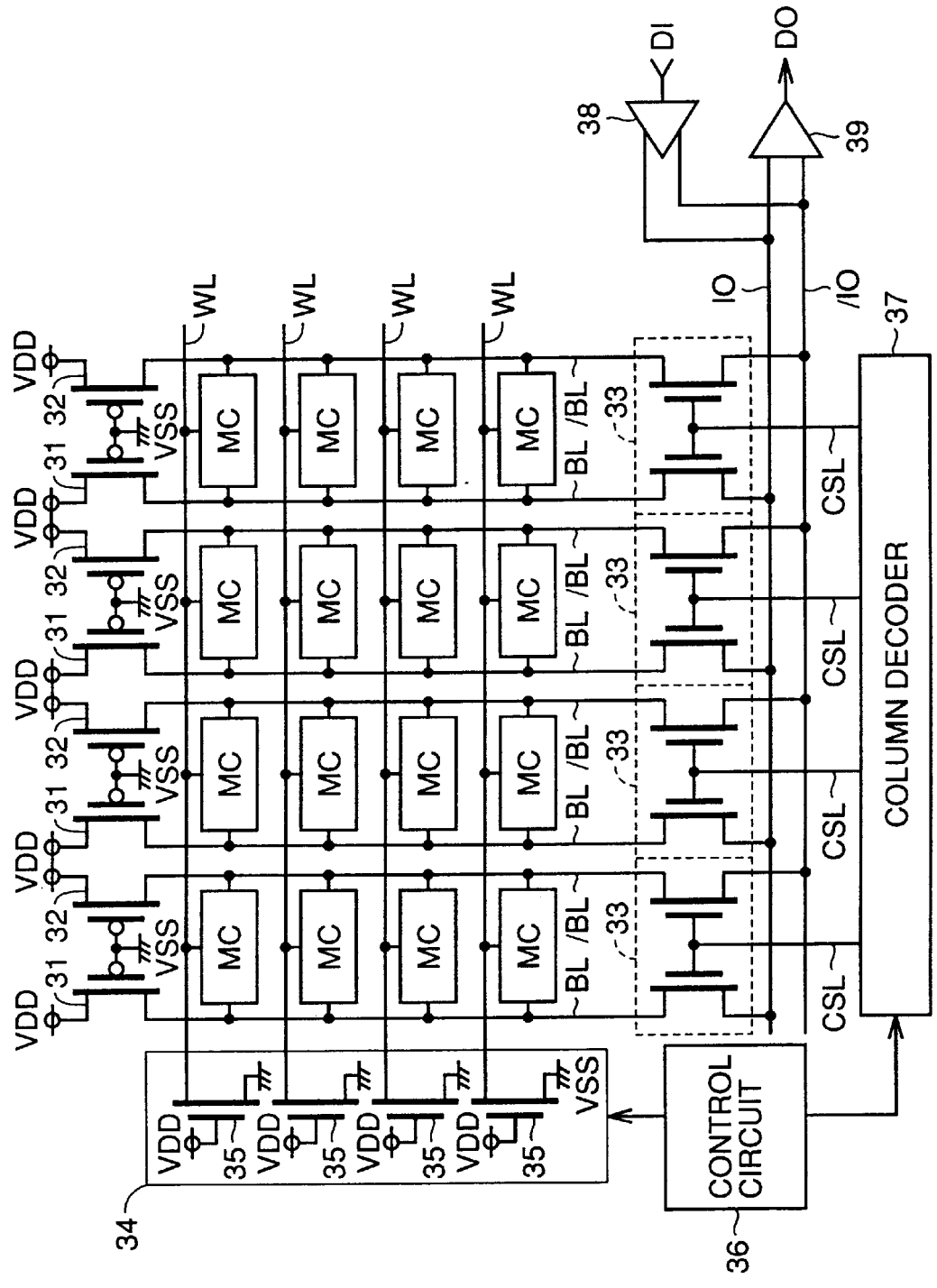
FIG. 10 is a circuit block diagram illustrating an overall construction of a conventional SRAM.

FIG. 7 is a circuit block diagram illustrating an essential part of an SRAM according to the second embodiment of the present invention, and is a view compared with FIG. 10.

Referring to FIG. 7, the difference of this SRAM from the SRAM of FIG. 10 lie in that the memory cells MC are of laterally elongated type, P-channel MOS transistors 21, 22 are added to each pair of bit lines BL, /BL, the memory cell power source line MVL is provided corresponding to each column to extend in the same direction as the pair of bit lines BL, /BL, and the program circuit 2 (not illustrated) of FIG. 1 is provided corresponding to each memory cell column.

The P-channel MOS transistor 21 is connected between the line of the power source potential VDD and the source of the P-channel MOS transistors 31, 32. Like the P-channel MOS transistor 1 of FIG. 1, the P-channel MOS transistor 22 has a comparatively high resistance value (higher than about 10 KΩ), and is connected between the line of the power source potential VDD' and the memory cell power source line MVL. Each of the output signals φE1 to φEn of n program circuits 2 respectively provided corresponding to n columns (here, n is a natural number), is input into the gates of the P-channel MOS transistors 21, 22 of the corresponding column.

Figure 8A:
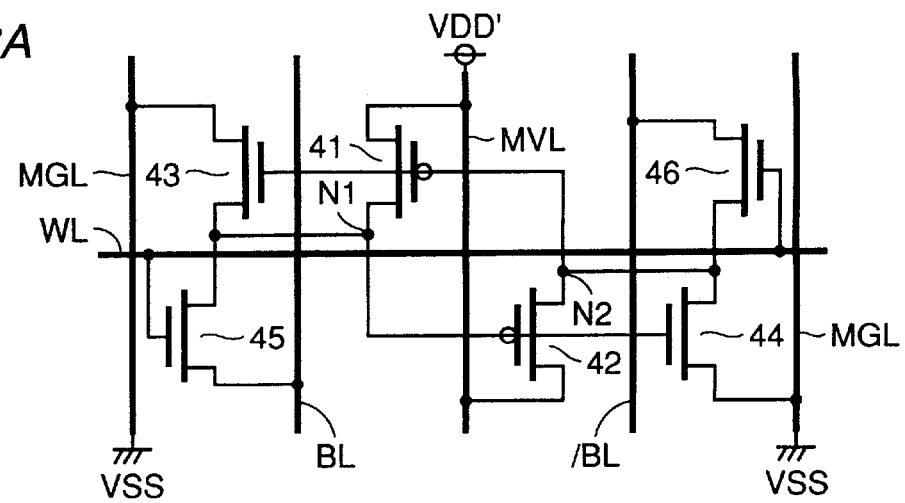
FIGS. 8A to 8C are views illustrating a construction and a layout of a memory cell shown in FIG. 7.
Figure 11A:
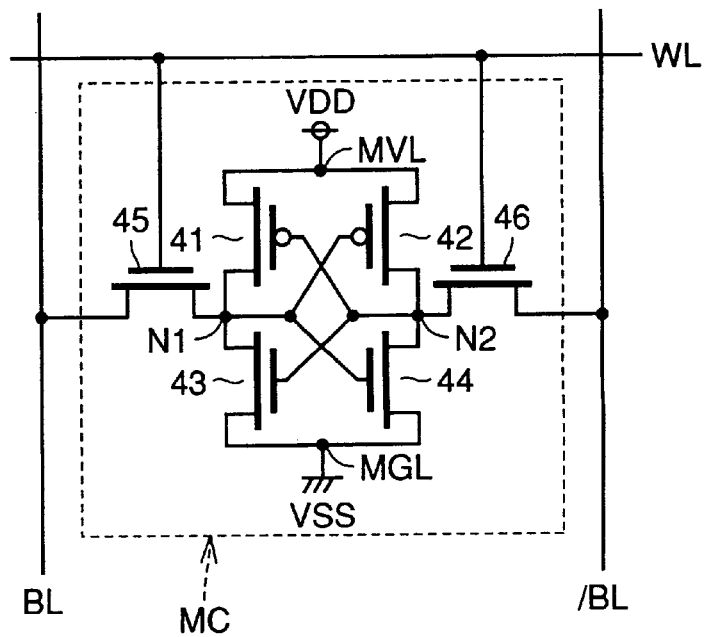
FIGS. 11A to 11B are views illustrating a construction and a layout of a memory cell shown in FIG. 10.
Figure 11B:
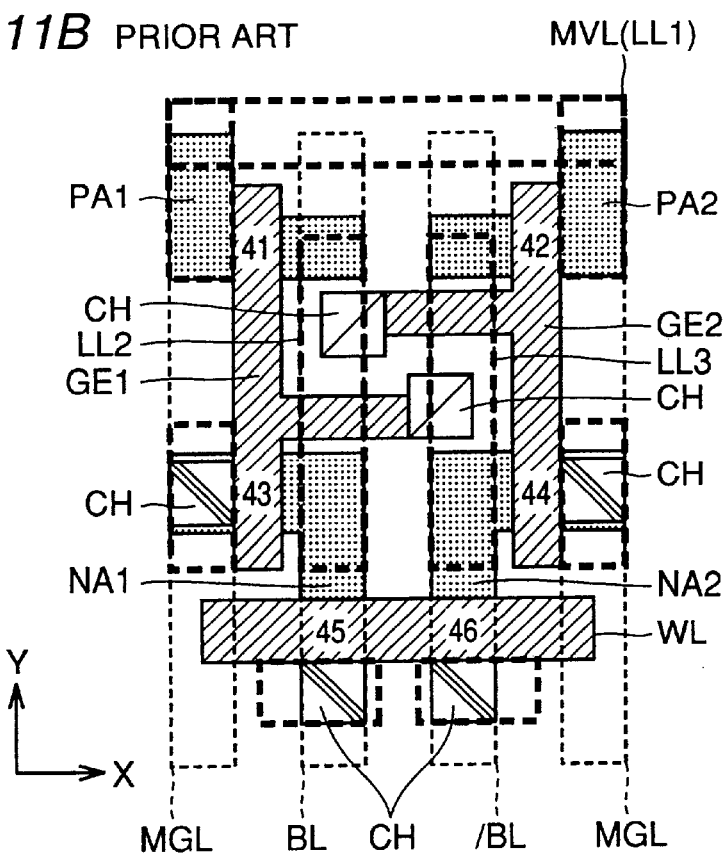
Figure 12A:
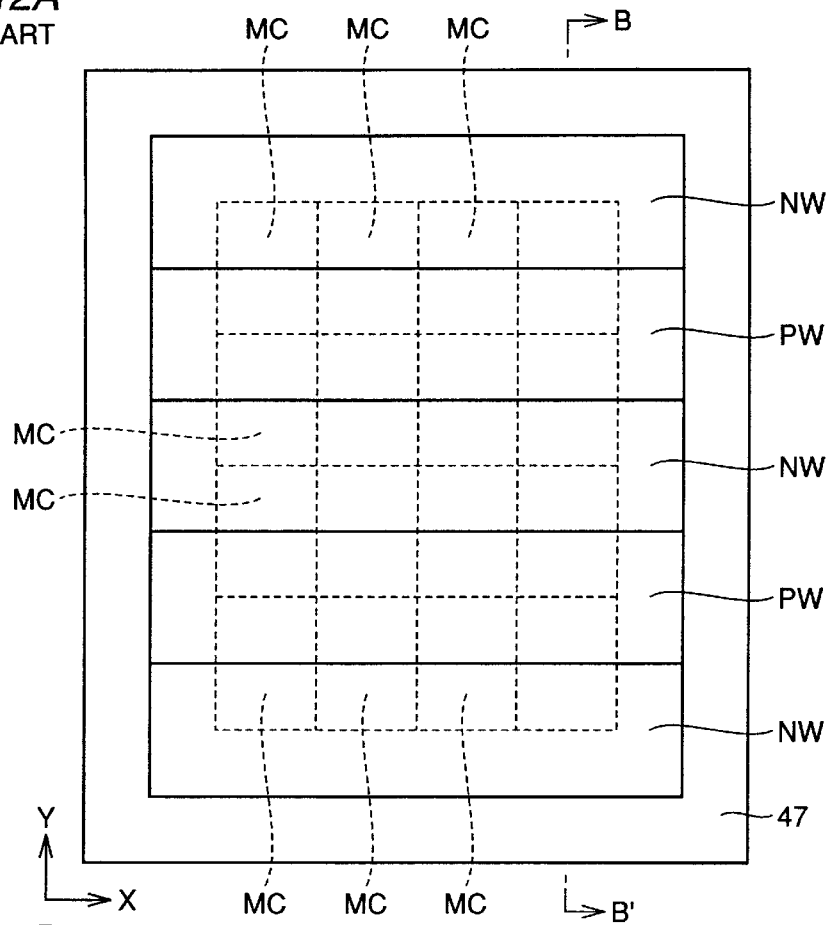
FIGS. 12A and 12B are views illustrating a substrate of the memory cell shown in FIGS. 11A and 11B.
Figure 12B:
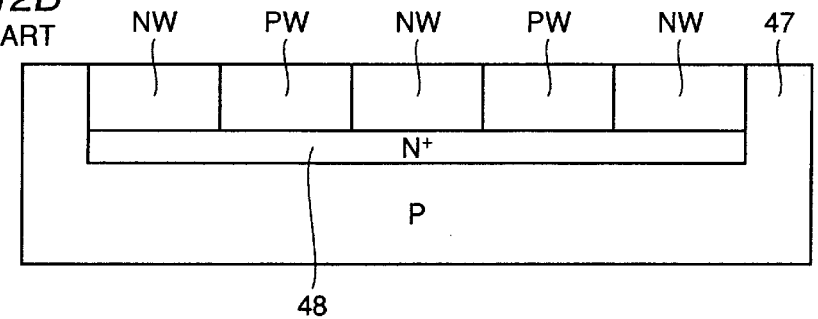

Referring to FIG. 8A, a laterally elongated type memory cell MC includes load transistors (P-channel MOS transistors) 41, 42, driver transistors (N-channel MOS transistors) 43, 44, and access transistors (N-channel MOS transistors) 45, 46, in the same manner as the longitudinally elongated type memory cell MC illustrated in FIGS. 11A and 11B. The laterally elongated type memory cell MC and the longitudinally elongated type memory cell MC are different in the layout of the transistors 41 to 46 and others.

Figure 8B:
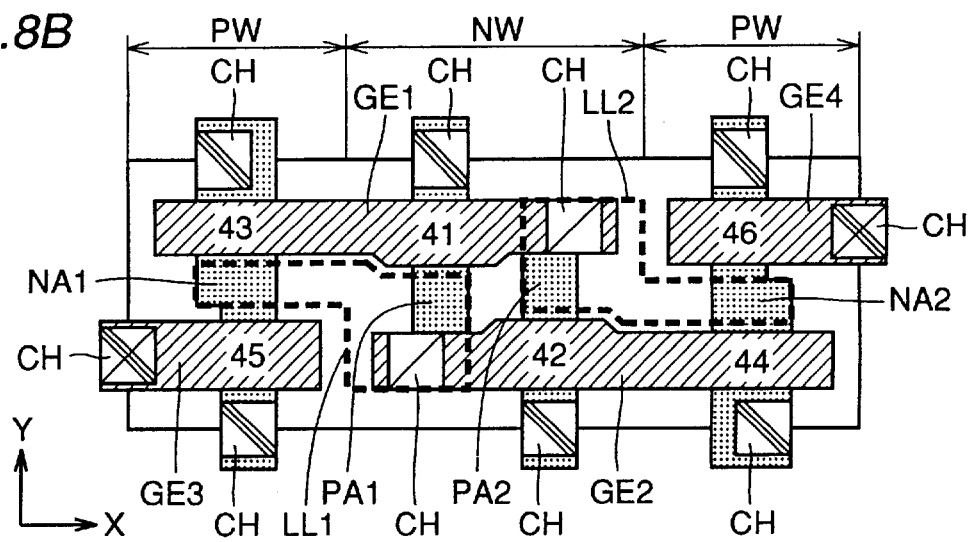

Namely, the laterally elongated type memory cell MC is formed on the surface of one N-type well NW and P-type wells PW, PW disposed on both sides thereof, as illustrated in FIG. 8B. First, a gate electrode GE1 extending from the N-type well NW to one of the P-type wells PW, PW in the X-direction in FIG. 8A, a gate electrode GE2 extending from the N-type well NW to the other of the P-type wells PW, PW in the X-direction in FIG. 8A, a gate electrode GE3 extending in the X-direction in FIG. 8A on one of the P-type wells PW, PW, and a gate electrode GE4 extending in the X-direction in FIG. 8A on the other of the P-type wells PW, PW are formed of a polysilicon layer.

Next, an N-type active layer NA1 is formed in one of the P-type wells PW, PW to cross the gate electrodes GE1, GE3, an N-type active layer NA2 is formed in the other of the P-type wells PW, PW to cross the gate electrodes GE2, GE4, and P-type active layers PA1, PA2 are formed in the N-type well NW to cross the gate electrodes GE1, GE2, respectively.

The gate electrode GE1 together with the P-type active layer PA1, and the gate electrode GE2 together with the P-type active layer PA2 constitute the P-channel MOS transistors 41, 42, respectively. The gate electrode GE1 together with the N-type active layer NA1, and the gate electrode GE3 together with the N-type active layer NA1 constitute the N-channel MOS transistors 43, 45, respectively. The gate electrode GE2 together with the N-type active layer NA2, and the gate electrode GE4 together with the N-type active layer NA2 constitute the N-channel MOS transistors 44, 46, respectively.

Next, a local wiring line LL1 is formed to extend over a central part of the N-type active layer NA1, one end of the P-type active layer PA1, and one end of the gate electrode GE2, and a local wiring line LL2 is formed to extend over a central part of the N-type active layer NA2, one end of the P-type active layer PA1, and one end of the gate electrode GE1. Referring to FIG. 8B, the part where the local wiring line LL1 overlaps with the active layers NA1, PA1 is electrically conducted, and the part where the local wiring line LL2 overlaps with the active layers NA2, PA2 is electrically conducted. The gate electrode GE2 and the local wiring line LL1, and the gate electrode GE1 and the local wiring line LL2 are respectively connected with each other via contact holes CH, CH.

Figure 8C:
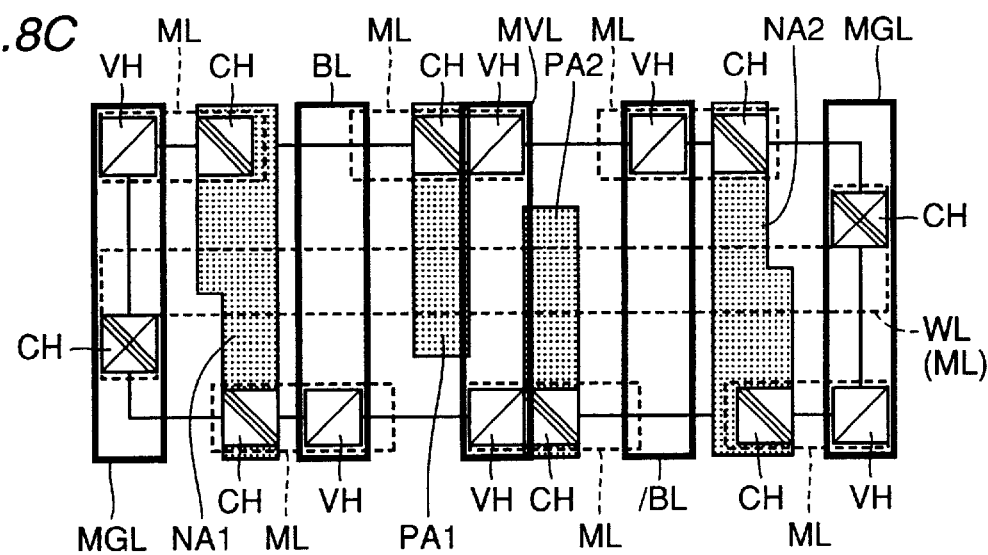

Next, referring to FIG. 8C, a plurality of metal wiring lines ML extending in the X-direction in FIG. 8C are formed of a first aluminum wiring layer, and further thereabove, a memory cell ground line MGL, a bit line BL, a memory cell power source line MVL, a bit line /BL, and a memory cell ground line MGL extending in the Y-direction in FIG. 8C are formed of a second aluminum wiring layer. Among the plurality of metal wiring lines ML, a metal wiring line that crosses over a central part of the memory cell becomes a word line WL.

One end of the P-type active layer PA1 (the source of the P-channel MOS transistor 41) is connected to the memory cell power source line MVL via a contact hole CH, a metal wiring ML, and a via hole VH. One end of the P-type active layer PA2 (the source of the P-channel MOS transistor 42) is connected to the memory cell power source line MVL via a contact hole CH, a metal wiring ML, and a via hole VH.

One end of the N-type active layer NA1 (the source of the N-channel MOS transistor 43) is connected to the memory cell ground line MGL via a contact hole CH, a metal wiring ML, and a via hole VH. One end of the N-type active layer NA2 (the source of the N-channel MOS transistor 44) is connected to the memory cell ground line MGL via a contact hole CH, a metal wiring ML, and a via hole VH.

The other end of the N-type active layer NA1 (the drain of the N-channel MOS transistor 45) is connected to the bit line BL via a contact hole CH, a metal wiring ML, and a via hole VH. The other end of the N-type active layer NA2 (the drain of the N-channel MOS transistor 46) is connected to the bit line /BL via a contact hole CH, a metal wiring ML, and a via hole VH. The gate electrodes GE3, GE4 are respectively connected to the word line WL via contact holes CH, CH.

Figure 9A:
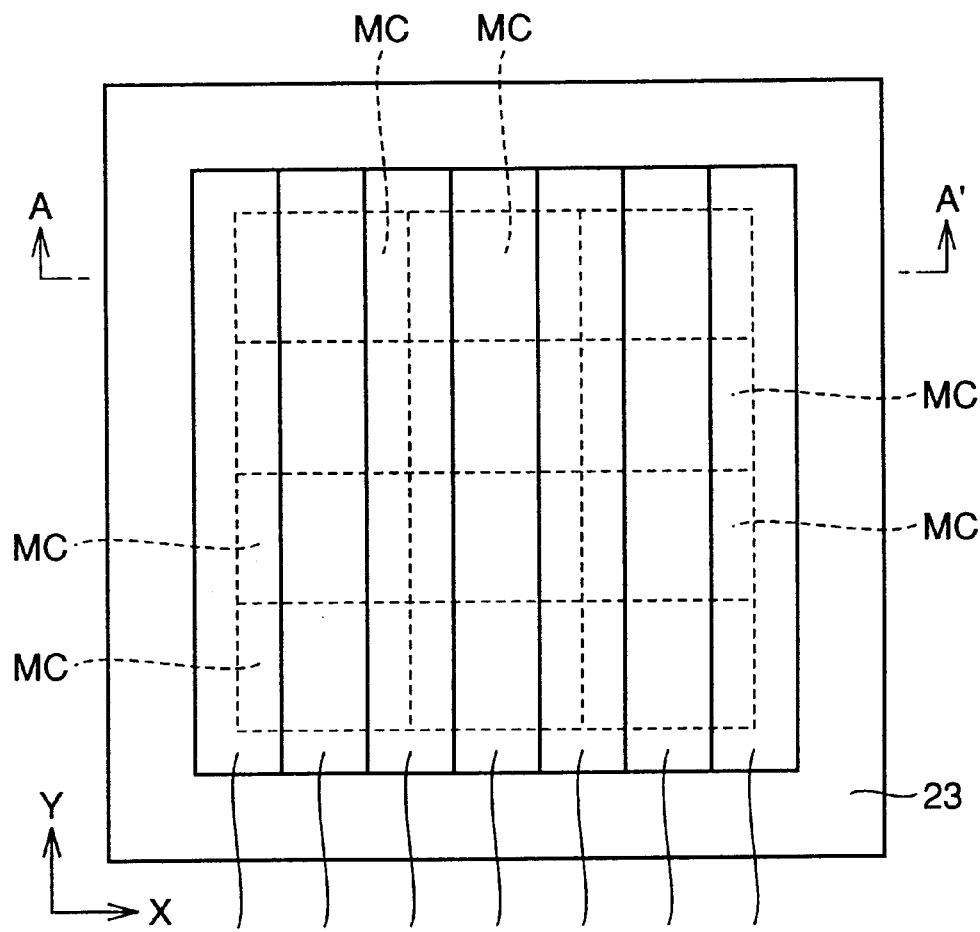
FIGS. 9A and 9B are views illustrating a substrate of the memory cell shown in FIGS. 8A to 8C.
Figure 9B:
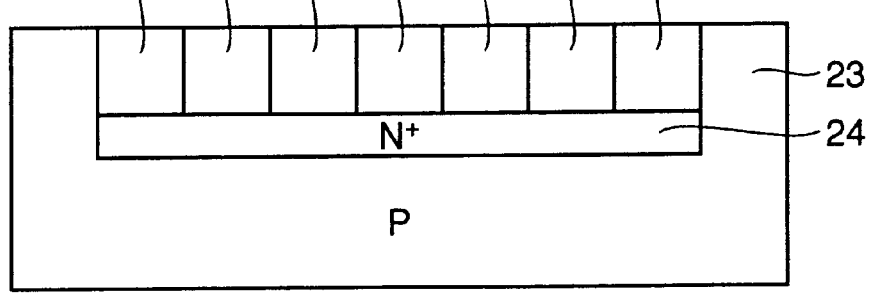

The substrate of the memory cells MC is formed to have a triple well structure, as illustrated in FIGS. 9A and 9B. Namely, an N$^+$-type buried layer 24 is formed on the surface of a P-type silicon substrate 23, a plurality (four in the drawings) of P-type wells PW are formed on the surface thereof, and three N-type wells NW are respectively formed between the four P-type wells PW. Each memory cell MC is formed on the surface of an N-type well NW and P-type wells PW adjacent thereto on both sides. The P-type well PW is used in common by the two memory cells that are adjacent to each other in the X-direction in the drawings. In FIGS. 9A and 9B, twelve memory cells MC are shown to be arranged in four rows and three columns.

Next, a method of using this SRAM will be described. First, a test is carried out to examine whether each memory cell MC is proper or not, and the memory cell column including a defective memory cell MC is replaced with a spare memory cell column, and the fuse 3 of the program circuit 2 corresponding to the memory cell column including the defective memory cell MC is blown.

In the memory cell column where the fuse 3 has not been blown, the output signal (for example, φE1 to φEn−1) of the program circuit 2 is brought to the "L" level to let the P-channel MOS transistors 21, 22 become electrically conducted. This allows the power source potential VDD to be given to the bit lines BL, /BL from the line of the power source potential VDD via the P-channel MOS transistors 21, 31, 32, and the power source potential VDD' is given to the memory cell power source line MVL from the line of the power source potential VDD' via the P-channel MOS transistor 22, whereby each memory cell column operates properly.

In contrast, in the memory cell column where the fuse 3 has been blown, the output signal (φEn in this case) of the program circuit 2 is brought to the "H" level to let the P-channel MOS transistors 21, 22 become electrically non-conducted. This allows the bit lines BL, /BL and the memory cell power source line MVL of the column to be in a floating state and, even if short-circuits of (1) to (9) are present in a memory cell MC of the column, electric currents do not flow through the short-circuited part. Therefore, in this SRAM, the leakage electric current generated by the short-circuits of (1) to (9) can be eliminated simply by blowing a single fuse 3, and the standby electric current can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device including a plurality of memory cells arranged in plural rows and plural columns, a word line provided corresponding to each row, and a pair of bit lines provided corresponding to each column, and adopting a redundancy system in which a defective row or column is replaced with a spare row or column, said static type semiconductor memory device comprising:

a first switching element which is provided corresponding to each word line and which is connected between the corresponding word line and a line of a reference potential for setting the corresponding memory cells to be in a non-activated state by becoming electrically conducted when the corresponding word line is not selected;

a power source line having two ends which is provided corresponding to each row or column and whose one end is connected to a power source node of each memory cell in the corresponding row or column;

a second switching element which is provided corresponding to each power source line and which is connected between the other end of the corresponding power source line and a line of a power source potential, said second switching element having a predetermined conduction resistance value larger than a conduction resistance value of said first switching element; and a program circuit which is provided corresponding to each row or column and which includes a fuse that is blown when the corresponding row or column is defective, said program circuit letting said second switching element become electrically non-conducted according as the fuse is blown.

2. The static type semiconductor memory device according to claim 1, wherein said power source line and said program circuit are provided corresponding to each column, said static type semiconductor memory device further comprises:

a bit line load element having two electrodes which is provided corresponding to each bit line and whose one electrode is connected to the corresponding bit line; and a third switching element which is provided corresponding to each column and which is connected between the other electrode of each bit line load element of the corresponding column and a line of a power source potential, and said program circuit lets said third switching element as well as said second switching element become electrically non-conducted according as said fuse is blown.

3. The static type semiconductor memory device according to claim 1, wherein said program circuit includes:

a fourth switching element which is connected between a first node and a line of a first potential and which becomes electrically conducted according as a reset signal changes from a first level to a second level for resetting a potential of said first node to said first potential;

a fifth switching element which is connected in series with said fuse between said first node and a line of a second potential and which becomes electrically conducted according as said reset signal changes from said second level to said first level for setting the potential of said first node to said second potential when said fuse has not been blown; and a latch circuit which latches the potential of said first node according as a predetermined period of time has passed after said reset signal changed from said second level to said first level, for letting said second switching element become electrically non-conducted when the latched potential is said first potential.

4. The static type semiconductor memory device according to claim 1, further comprising:

a semiconductor substrate of first conductivity type;

a semiconductor buried layer of second conductivity type formed on a surface of said semiconductor substrate;

a plurality of first wells of first conductivity type formed on a surface of said semiconductor buried layer; and a plurality of second wells of second conductivity type formed on a surface of said semiconductor buried layer between said plurality of first wells respectively, wherein said plurality of memory cells are formed on a surface of said plurality of first wells and said plurality of second wells.

5. The static type semiconductor memory device according to claim 1, wherein said second switching element includes a transistor having said predetermined conduction resistance value.

6. The static type semiconductor memory device according to claim 1, wherein said second switching element includes:

a resistor element having said predetermined conduction resistance value; and a transistor which is connected in series with said resistor element between the other end of said power source line and the line of said power source potential.

* * * * *